(12) United States Patent
Bauer (10) Patent No.: US 11,644,484 B2
(45) Date of Patent: May 9, 2023

(54) ELECTRICAL SENSOR ASSEMBLY

(71) Applicant: G&W Electric Company, Bolingbrook, IL (US)

(72) Inventor: Alberto Bauer, Dubai (AE)

(73) Assignee: G & W Electric Company, Bolingbrook, IL (US)

( * ) Notice: Subject to any disclaimer, the term of this patent is extended or adjusted under 35 U.S.C. 154(b) by 0 days.

(21) Appl. No.: 17/664,585

(22) Filed: May 23, 2022

(65) Prior Publication Data

US 2022/0357364 A1 Nov. 10, 2022

Related U.S. Application Data

(63) Continuation of application No. 17/414,887, filed as application No. PCT/US2019/066899 on Dec. 17, 2019, now Pat. No. 11,340,266.

(30) Foreign Application Priority Data

Dec. 17, 2018 (IT) .......................... 102018000011146
Dec. 17, 2018 (IT) .......................... 202018000003942

(51) Int. Cl.
*G01R 15/16* (2006.01)
*G01R 19/00* (2006.01)

(52) U.S. Cl.
CPC ....... *G01R 15/165* (2013.01); *G01R 19/0084* (2013.01); *G01R 15/16* (2013.01); *G01R 19/0092* (2013.01)

(58) Field of Classification Search
CPC ........ G01R 15/00; G01R 15/14; G01R 15/16; G01R 15/165; G01R 19/00; G01R 19/0084; G01R 19/0092; G01R 29/00; G01R 29/12

(Continued)

(56) References Cited

U.S. PATENT DOCUMENTS 3,396,339 A 8/1968 Miram
3,835,353 A 9/1974 Hermstein et al.
(Continued)

FOREIGN PATENT DOCUMENTS

CN 105588966 A 5/2016
DE 2149881 A1 2/1973
(Continued)

OTHER PUBLICATIONS

European Patent Office. Extended European Search Report for application 19901142.0, dated Sep. 26, 2022 (12 pages).
(Continued)

*Primary Examiner* — Hoai-An D. Nguyen
(74) *Attorney, Agent, or Firm* — Michael Best & Friedrich LLP (57) ABSTRACT

A sensor assembly includes a connecting bar extending along a longitudinal axis and a tubular body extending along the longitudinal axis and at least partially surrounding the connecting bar such that the tubular body is radially spaced from the connecting bar. The tubular body includes a support member made of insulating material. The tubular body also includes a first section with an electric field sensor comprising a first layer of electrically conductive material on an inner surface of the support member to detect an electric field produced by the connecting bar. The first section also includes a first electric screen comprising a second layer of electrically conductive material on an outer surface of the support member to shield the electric field sensor from outside electrical interference. A second section disposed adjacent the first section includes a second electric screen. A dielectric material at least partially encloses the tubular body.

26 Claims, 10 Drawing Sheets

(58) Field of Classification Search
USPC .......................... 324/76.11, 126, 127, 530
See application file for complete search history.

(56) References Cited

U.S. PATENT DOCUMENTS

| | | | |
|---|---|---|---|
| 4,241,373 | A | 12/1980 | Mara et al. |
| 4,268,889 | A | 5/1981 | Wolfendale |
| 4,700,123 | A | 10/1987 | Beling |
| 5,136,241 | A | 8/1992 | Blank et al. |
| 5,661,240 | A | 8/1997 | Kemp |
| 5,991,177 | A | 11/1999 | Kaczkowski |
| 6,252,388 | B1 | 6/2001 | Jaeger et al. |
| 6,307,385 | B1 | 10/2001 | Tardif et al. |
| 7,466,146 | B2 | 12/2008 | Stewart et al. |
| 7,541,816 | B1 | 6/2009 | Liao et al. |
| 7,595,648 | B2 | 9/2009 | Ungaretti et al. |
| 8,242,840 | B2 | 8/2012 | Van Veldhoven |
| 8,283,934 | B2 | 10/2012 | Nishizono |
| 8,294,477 | B2 | 10/2012 | Handshoe et al. |
| 8,446,157 | B2 | 5/2013 | Frojd |
| 8,847,353 | B2 | 9/2014 | Hasunuma |
| 9,118,330 | B2 | 8/2015 | Beyly et al. |
| 9,291,651 | B2 | 3/2016 | Bauer |
| 9,389,246 | B2 | 7/2016 | Juds et al. |
| 9,568,506 | B2 | 2/2017 | Fujinoki |
| 9,696,348 | B2 | 7/2017 | Juds et al. |
| 9,739,807 | B2 | 8/2017 | Barba Jimenez |
| 9,739,816 | B2 | 8/2017 | Flanagan |
| 9,739,820 | B2 | 8/2017 | Gravermann et al. |
| 9,742,180 | B2 | 8/2017 | Wentzel et al. |
| 9,846,024 | B1 | 12/2017 | Noras |
| 9,921,246 | B2 | 3/2018 | Bauer |
| 9,958,505 | B2 | 5/2018 | Honda |
| 9,983,032 | B1 | 5/2018 | Kraver et al. |
| 10,025,423 | B2 | 7/2018 | Aas et al. |
| 10,088,963 | B2 | 10/2018 | Otagaki et al. |
| 10,203,814 | B2 | 2/2019 | Ryynanen et al. |
| 10,215,778 | B2 | 2/2019 | Gravermann et al. |
| 10,317,442 | B2 | 6/2019 | Kawaguchi et al. |
| 10,338,103 | B2 | 7/2019 | Gravermann et al. |
| 10,345,340 | B2 | 7/2019 | Gravermann et al. |
| 10,425,079 | B1 | 9/2019 | Bytheway |
| 10,591,523 | B2 | 3/2020 | Pak et al. |
| 10,753,962 | B2 | 8/2020 | Testa et al. |
| 10,790,822 | B2 | 9/2020 | Wendt et al. |
| 11,048,367 | B2 | 6/2021 | Reynolds et al. |
| 11,079,410 | B2 | 8/2021 | Bauer et al. |
| 11,287,456 | B2 | 3/2022 | Wang et al. |
| 11,346,876 | B2 | 5/2022 | Bauer |
| 11,378,594 | B2 | 7/2022 | Djogo |
| 11,415,611 | B2 | 8/2022 | Zhang et al. |
| 2001/0048308 | A1 | 12/2001 | Potter et al. |
| 2005/0122118 | A1 | 6/2005 | Zank et al. |
| 2006/0033508 | A1 | 2/2006 | Lee |
| 2006/0119369 | A1 | 6/2006 | Kawahata et al. |
| 2006/0238233 | A1 | 10/2006 | Kraus |
| 2007/0086130 | A1 | 4/2007 | Sorensen |
| 2008/0011093 | A1 | 1/2008 | Shank et al. |
| 2010/0107775 | A1 | 5/2010 | Wang et al. |
| 2010/0283487 | A1 | 11/2010 | Juds et al. |
| 2010/0318306 | A1 | 12/2010 | Tierney et al. |
| 2011/0012623 | A1 | 1/2011 | Gastel et al. |
| 2011/0121820 | A1 | 5/2011 | Handshoe et al. |
| 2011/0121842 | A1 | 5/2011 | Bauer et al. |
| 2011/0204879 | A1 | 8/2011 | Peretto |
| 2011/0205683 | A1 | 8/2011 | Peretto |
| 2011/0221452 | A1 | 9/2011 | Shyue |
| 2011/0234311 | A1 | 9/2011 | Hirashiki et al. |
| 2011/0298454 | A1 | 12/2011 | Ausserlechner |
| 2012/0261384 | A1 | 10/2012 | Labianco et al. |
| 2012/0326734 | A1 | 12/2012 | Cho et al. |
| 2013/0043891 | A1 | 2/2013 | Handshoe et al. |
| 2014/0300374 | A1 | 10/2014 | Mckenzie et al. |
| 2014/0354302 | A1 | 12/2014 | Lu et al. |
| 2014/0370741 | A1 | 12/2014 | Bolcato et al. |
| 2015/0279642 | A1 | 10/2015 | Prance |
| 2015/0346907 | A1 | 12/2015 | Nakajima et al. |
| 2016/0005511 | A1 | 1/2016 | Gravermann et al. |
| 2016/0061864 | A1 | 3/2016 | White et al. |
| 2016/0103174 | A1 | 4/2016 | Aaltonen et al. |
| 2016/0139181 | A1 | 5/2016 | Gravermann et al. |
| 2016/0202286 | A1 | 7/2016 | Aaltonen et al. |
| 2016/0245845 | A1 | 8/2016 | Bauer |
| 2017/0030946 | A1 | 2/2017 | Gravermann et al. |
| 2017/0038414 | A1 | 2/2017 | Barba Jimenez |
| 2017/0061187 | A1 | 3/2017 | Wen |
| 2017/0067938 | A1 | 3/2017 | Kasai |
| 2017/0067939 | A1 | 3/2017 | Imai et al. |
| 2017/0184634 | A1 | 6/2017 | Wentzel |
| 2017/0234908 | A1 | 8/2017 | Gravermann et al. |
| 2017/0250499 | A1 | 8/2017 | Sica et al. |
| 2017/0276723 | A1 | 9/2017 | Buffa et al. |
| 2017/0363660 | A1 | 12/2017 | Gravermann |
| 2018/0092557 | A1 | 4/2018 | Bickford et al. |
| 2018/0100878 | A1 | 4/2018 | Pearce et al. |
| 2018/0292435 | A1 | 10/2018 | Wentzel et al. |
| 2018/0374644 | A1 | 12/2018 | Stollwerck et al. |
| 2019/0146006 | A1 | 5/2019 | Sanchez Ruiz et al. |
| 2019/0181860 | A1 | 6/2019 | Cholasta |
| 2019/0234995 | A1 | 8/2019 | Peretto |
| 2019/0237260 | A1 | 8/2019 | Stollwerck et al. |
| 2019/0324073 | A1 | 10/2019 | Mikami |
| 2020/0064376 | A1 | 2/2020 | Loyd et al. |
| 2020/0124642 | A1 | 4/2020 | Djogo |
| 2020/0158762 | A1 | 5/2020 | Wilson et al. |
| 2020/0200936 | A1 | 6/2020 | Kruger |
| 2020/0256896 | A1 | 8/2020 | Bauer et al. |
| 2021/0018537 | A1 | 1/2021 | Bauer |
| 2021/0072289 | A1 | 3/2021 | Peretto et al. |
| 2021/0206418 | A1 | 7/2021 | Nakano et al. |
| 2021/0302478 | A1 | 9/2021 | Kapoor et al. |
| 2021/0356499 | A1 | 11/2021 | Ferraro et al. |
| 2021/0359533 | A1 | 11/2021 | Hatano |
| 2022/0043033 | A1 | 2/2022 | Bauer |
| 2022/0065910 | A1 | 3/2022 | Ellis, Jr. et al. |
| 2022/0123748 | A1 | 4/2022 | Willis et al. |
| 2022/0311441 | A1 | 9/2022 | Liu |
| 2022/0317158 | A1 | 10/2022 | Stollwerck et al. |

FOREIGN PATENT DOCUMENTS

| | | | |
|---|---|---|---|
| DE | 19613688 | A1 | 10/1997 |
| DE | 102017000723 | A1 | 8/2018 |
| EP | 0677747 | A2 | 10/1995 |
| EP | 0912902 | A1 | 5/1999 |
| EP | 2366108 | B1 | 8/2012 |
| EP | 2993480 | A1 | 3/2016 |
| EP | 3513202 | A1 | 7/2019 |
| EP | 3828553 | A1 | 6/2021 |
| EP | 3840135 | A1 | 6/2021 |
| EP | 3862760 | A1 | 8/2021 |
| EP | 3913379 | A1 | 11/2021 |
| EP | 3881085 | A4 | 7/2022 |
| EP | 4058815 | A1 | 9/2022 |
| ES | 2221551 | A1 | 12/2004 |
| GB | 967853 | A | 8/1964 |
| GB | 2203557 | A | 10/1988 |
| WO | 2009153824 | A1 | 12/2009 |
| WO | 2010070693 | A1 | 6/2010 |
| WO | 2011033548 | A1 | 3/2011 |
| WO | 2011125725 | A1 | 10/2011 |
| WO | 2011157047 | A8 | 1/2013 |
| WO | 2013026423 | A1 | 2/2013 |
| WO | 2013042155 | A2 | 3/2013 |
| WO | 2016109009 | A1 | 7/2016 |
| WO | 2017050039 | A1 | 3/2017 |
| WO | 2017050042 | A1 | 3/2017 |
| WO | 2017050044 | A1 | 3/2017 |
| WO | 2017050045 | A1 | 3/2017 |
| WO | 2017050058 | A1 | 3/2017 |
| WO | 2018069949 | A2 | 4/2018 |
| WO | 2018096567 | A2 | 5/2018 |
| WO | 2018114661 | A1 | 6/2018 |
| WO | WO-2018179017 | A1 * | 10/2018 ............ G01R 15/16 |

(56) References Cited

FOREIGN PATENT DOCUMENTS

| WO | 2019073497 A1 | 4/2019 |
| WO | 2019186607 A1 | 10/2019 |
| WO | 2020109283 A2 | 6/2020 |
| WO | 2020131909 A1 | 6/2020 |
| WO | 2021061153 A1 | 4/2021 |
| WO | 2021180642 A1 | 9/2021 |
| WO | 2022069967 A1 | 4/2022 |
| WO | 2022072130 A1 | 4/2022 |
| WO | 2022094645 A1 | 5/2022 |
| WO | 2022124942 A1 | 6/2022 |

OTHER PUBLICATIONS

International Search Report and Written Opinion for Related Application No. PCT/IT2017/000225 dated May 4, 2018 (11 pages).
International Search Report and Written Opinion for Related Application No. PCT/IT2018/000037 dated Jul. 17, 2018 (9 pages).
International Preliminary Report on Patentability for Application No. PCT/IT2019/000023 dated Oct. 15, 2020 (7 pages).
International Preliminary Report on Patentability for Application No. PCT/US2019/066899 dated Jul. 1, 2021 (9 pages).
International Preliminary Report on Patentability for Application No. PCT/US2019/066906 dated Jul. 1, 2021 (7 pages).
International Search Report and Written Opinion and Application No. PCT/US2019/066906 dated Mar. 18, 2020 (7 pages).
International Search Report and Written Opinion for Application No. PCT/IT2019/000023 dated Jul. 26, 2019 (9 pages).
International Search Report and Written Opinion for Application No. PCT/US2019/053525 dated Jun. 29, 2020 (12 pages).
International Search Report and Written Opinion for Application No. PCT/US2019/066899 dated Mar. 5, 2020 (10 pages).

* cited by examiner

ELECTRICAL SENSOR ASSEMBLY

CROSS-REFERENCE TO RELATED APPLICATIONS

This application is a continuation of co-pending U.S. patent application Ser. No. 17/414,887, filed Jun. 16, 2021, which is a national stage application of International Patent Application No. PCT/US2019/066899, filed Dec. 17, 2019, which claims priority to Italian Patent Application No. 102018000011146, filed Dec. 17, 2018, and to Italian Utility Model Application No. 202018000003942, filed Dec. 17, 2018, the entire contents of all of which are incorporated herein by reference.

FIELD OF THE DISCLOSURE

The present disclosure relates to an electrical sensor assembly, preferably intended for electrical transformers, electrical cabinets and other similar structures, that enables the electric field generated by a live connecting bar to be detected, for example to detect the voltage value of said connecting bar in relation to the detected electric field.

More specifically, the present disclosure relates to a sensor assembly that is able to detect the electric field generated by the connecting bar without being influenced by any surrounding electrical fields, such as the fields generated by other conductors arranged nearby.

BACKGROUND

Electrical sensor assemblies of the aforementioned type are known, but suffer from a series of drawbacks.

A first drawback is that said known sensor assemblies do not enable the electric field generated by the connecting bar to be detected without being influenced by other surrounding fields.

A second drawback is that said known sensor assemblies are somewhat large.

A third drawback is that said known sensor assemblies do not enable electrical fields and/or related magnitudes to be measured with sufficient accuracy.

A fourth drawback is that said known sensor assemblies are not immune to surrounding electrical fields generated, for example, by other conductors arranged nearby.

A fifth drawback is that said known sensor assemblies do not enable electrical fields and/or related magnitudes to be measured with sufficient accuracy in the presence of temperature variations.

A sixth drawback is that said known sensor assemblies do not retain over time the technical features required to perform the function of the sensor assembly and/or to maintain the required safety level (partial discharges, detachment, rapid ageing, etc.).

A seventh drawback is that said known sensor assemblies are complex and costly to make.

An eighth drawback is that, in said known sensor assemblies, the resin of dielectric material placed about the components of the sensor assembly have cavities (air bubbles), which results in unwanted partial discharging.

A ninth drawback is that, in said known sensor assemblies, said resin is detached from the elements that comprise the capacitive sensor, which results in unwanted partial discharging.

A tenth drawback is that, in said known sensor assemblies, said resin is not perfectly bonded and/or stuck and/or linked to the components that form the sensor assembly and consequently, ageing causes said resin to become detached from said members, which results in unwanted partial discharging. This drawback is particularly common where the sensor assembly is used in an environment in which the operating temperature (hot/cold) varies cyclically.

SUMMARY

Sensor assemblies according to embodiments of the present disclosure may advantageously resolve one or more of the aforementioned drawbacks.

For example, the present disclosure provides, in one aspect, a sensor assembly including a connecting bar extending along a longitudinal axis and a tubular body extending along the longitudinal axis and at least partially surrounding the connecting bar such that the tubular body is radially spaced from the connecting bar. The tubular body includes a support member made of an insulating material. The support member includes an inner surface and an outer surface opposite the inner surface. The tubular body also includes a first section with an electric field sensor comprising a first layer of electrically conductive material disposed on the inner surface of the support member. The electric field sensor is configured to detect an electric field produced by the connecting bar. The first section also includes a first electric screen comprising a second layer of electrically conductive material disposed on the outer surface of the support member, and the first electric screen is configured to shield the electric field sensor from outside electrical interference. The tubular body also includes a second section disposed adjacent the first section along the longitudinal axis, the second section including a second electric screen. The sensor assembly further includes a dielectric material at least partially enclosing the tubular body.

The present disclosure provides, in another aspect, a sensor assembly including a connecting bar extending along a longitudinal axis and a tubular body extending along the longitudinal axis and at least partially surrounding the connecting bar such that the tubular body is radially spaced from the connecting bar. The tubular body includes a support member made of an insulating material, the support member including an inner surface, an outer surface opposite the inner surface, and a plurality of cantilevered tabs extending parallel to the longitudinal axis. The tubular body also includes an electric field sensor comprising a first layer of electrically conductive material disposed on the inner surface of the support member, the electric field sensor configured to detect an electric field produced by the connecting bar, and a first electric screen comprising a second layer of electrically conductive material disposed on the outer surface of the support member, the first electric screen configured to shield the electric field sensor from outside electrical interference. The sensor assembly also includes a dielectric material at least partially enclosing the tubular body. Adjacent tabs of the plurality of cantilevered tabs are circumferentially spaced in order to form axial through openings therebetween.

The present disclosure provides, in another aspect, a sensor assembly including a connecting bar extending along a longitudinal axis and a body extending along the longitudinal axis and at least partially surrounding the connecting bar such that the body is radially spaced from the connecting bar. The body includes a support member made of an insulating material, with an inner surface and an outer surface. The body also includes a first section having an electric field sensor comprising a first layer of electrically conductive material disposed on the inner surface of the support member, the electric field sensor configured to detect an electric field produced by the connecting bar, and a first electric screen comprising a second layer of electrically conductive material disposed on the outer surface of the support member. The body also includes a second section having a second electric screen comprising a third layer of electrically conductive material, and a third section including a third electric screen comprising a fourth layer of electrically conductive material. The sensor assembly also includes a dielectric material at least partially enclosing the body. The first section is disposed between the second section and the third section along the longitudinal axis, and the first layer, the second layer, the third layer, and the fourth layer are electrically isolated from one another.

Other features and aspects of the disclosure will become apparent by consideration of the following detailed description and accompanying drawings.

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting.

DETAILED DESCRIPTION

With reference to attached FIGS. 1 to 5A, a sensor assembly according to embodiments of the present disclosure extends along a first longitudinal axis Y1 and includes a connecting bar B extending longitudinally along a respective second longitudinal axis Y2; a tubular body extending longitudinally along a third longitudinal axis Y3; a mass of dielectric material 40.1/40.2/40.3/40.4/40.5 designed to at least partially enclose the components of the sensor assembly, in which said tubular body is positioned coaxially about said connecting bar B and is spaced radially apart from said central connecting bar B.

Again with reference to attached FIGS. 1 to 5A, said tubular body has a first tubular section 10.1/10.2/10.3/10.4/10.5, which in the illustrated embodiments includes: a first self-supporting tubular laminar element or support member 11.1/11.2/11.3/11.4/11.5 made of insulating material; a first thin layer of electrically conductive material 12.1/12.2/12.3/12.4/12.5 applied to one or more inner faces of said first self-supporting tubular laminar element 11.1/11.2/11.3/11.4/11.5; and a second thin layer of electrically conductive material 13.1/13.2/13.3/13.4/13.5 applied to one or more outer faces of said first self-supporting tubular laminar element 11.1/11.2/11.3/11.4/11.5.

The first self-supporting tubular laminar element 11.1/11.2/11.3/11.4/11.5 may perform the function of a supporting structure and, more specifically, the function of a tubular element not liable to suffer from deformation when casting resin and providing support using layers of conductive material.

The first thin layer of electrically conductive material 12.1/12.2/12.3/12.4/12.5 may function as an electric field sensor and, more specifically, is able to form a first electrode for a capacitive coupling with the central bar B as second electrode.

The second thin layer of electrically conductive material 13.1/13.2/13.3/13.4/13.5 may function as an electric screen and, more specifically, by connection to ground or to a known potential, an electric screen able to screen or shield the electric field sensor formed by the first thin layer of electrically conductive material 12.1/12.2/12.3/12.4/12.5 from external electrical fields or interference.

The tubular body of the sensor assembly can also include a second tubular section 20.1/20.2/20.3/20.4/20.5; in which said second tubular section 20.1/20.2/20.3/20.4/20.5 is positioned axially beside a first axial end (10$sx$) of the first tubular section 10.1/10.2/10.3/10.4/10.5; in which said second tubular section 20.1/20.2/20.3/20.4/20.5 may function as an electric screen, by connecting to ground or to a reference potential, as explained below.

Furthermore, the tubular body of the sensor assembly can also include a third tubular section 30.1/30.2/30.3/30.4/30.5; in which said third tubular section (30.1/30.2/30.3/30.4/30.5) is positioned axially beside a second axial end 10$dx$ of the first tubular section 10.1/10.2/10.3/10.4/10.5; in which said third tubular section 30.1/30.2/30.3/30.4/30.5 may function as an electric screen, by connecting to ground or to a reference potential.

Said second tubular section 20.1/20.2/20.3/20.4/20.5 and/or said third tubular section 30.1/30.2/30.3/30.4/30.5 can also perform the function of an electric field sensor in order to detect the presence or absence of voltage on the connecting bar B.

The second tubular section 20.1/20.2/20.3/20.4/20.5 and/or said third tubular section 30.1/30.2/30.3/30.4/30.5 are associated with and/or linked to said first tubular section 10.1/10.2/10.3/10.4/10.5. Preferably, said first tubular section 10.1/10.2/10.3/10.4/10.5 and/or said second tubular section 20.1/20.2/20.3/20.4/20.5 and/or said third tubular section 30.1/30.2/30.3/30.4/30.5 includes one or more through-openings 14.1/14.2/14.3/14.4/14.5/21.1/21.2/21.3/21.4/21.4/31.1/31.2/31.3/31.4/31.5, which are wide enough to enable a resin of dielectric material in liquid/paste state to pass through said first through-openings 14.1/14.2/14.3/14.4/14.5; 21.1/21.2/21.3/21.4/21.5; 31.1/31.2/31.3/31.4/31.5.

Figure 1:
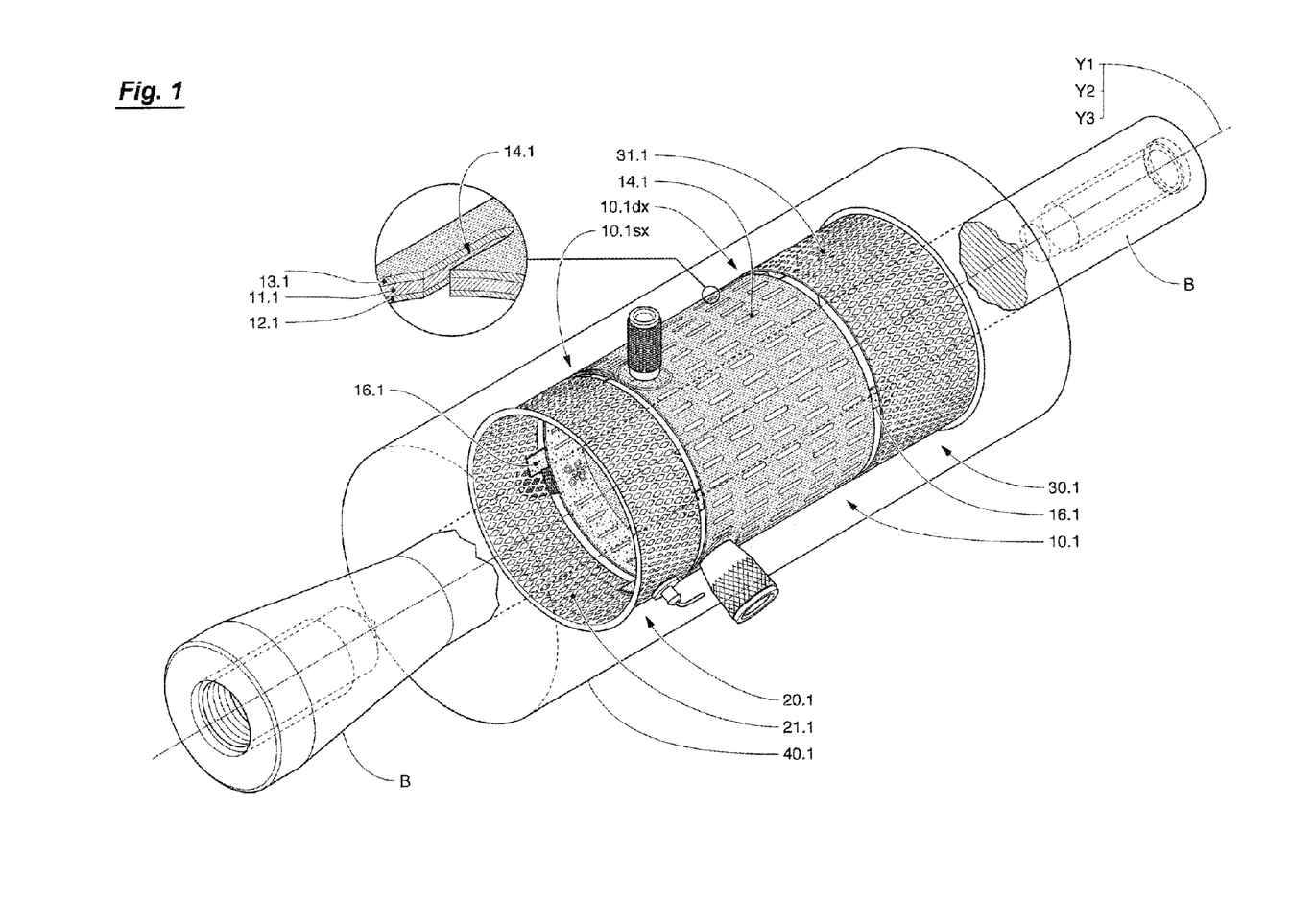
FIG. 1 is a schematic view of a first embodiment of a sensor assembly according to the present disclosure.
Figure 1A:
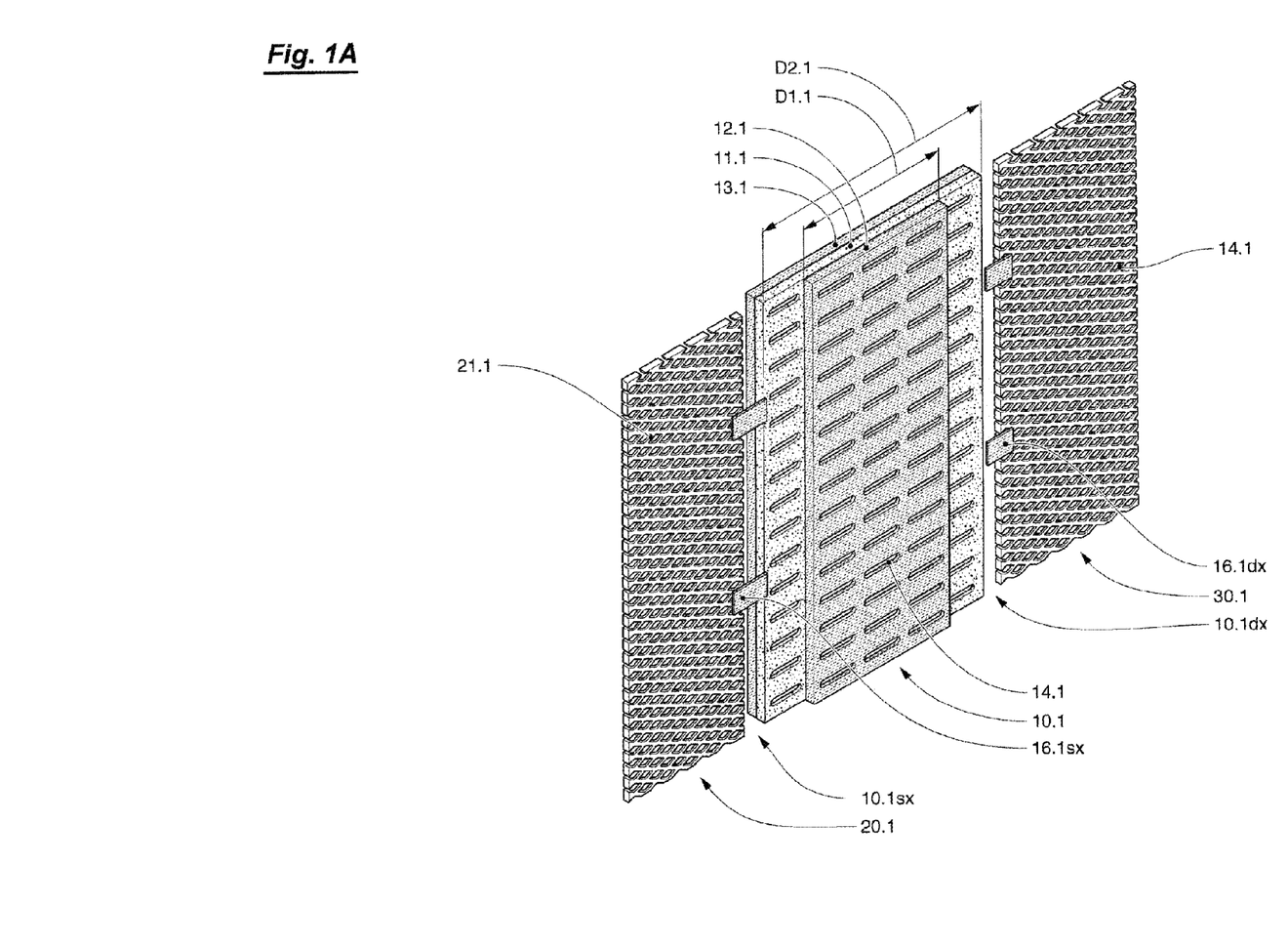
FIG. 1A is a schematic view of a tubular body in the embodiment in FIG. 1, laid flat.

With reference to FIGS. 1 and 1A, said first tubular section 10.1 can be made using a conductive double-sided Vetronite board (for example a copper double-sided Vetronite board—PCB) including a self-supporting lamina of insulating material 11.1 able to perform the support function, a first thin inner layer 12.1 of electrically conductive material detached from other layers of conductive material applied to said self-supporting lamina of insulating material 11.1 and a first thin outer layer 13.1 of conductive material applied to said self-supporting lamina of insulating material 11.1; in which the first thin inner layer 12.1 may function as an electric field sensor, i.e. to form a capacitive coupling with the bar B; and in which the first thin outer layer 13.1 may function as an electric screen, for example by means of a connection to ground.

Preferably, the first thin inner layer 12.1 of conductive material has an axial length D1.1 that is less than the axial length D2.1 of the first thin outer layer 13.1 of conductive material, preferably but without limitation as shown in FIG. 1A.

With reference to the aforementioned structural description, said first tubular section 10.1 may be made using a single conductive double-sided Vetronite board (for example a copper double-sided Vetronite board—PCB), for example etched by photoengraving or mechanical milling and wrapped into a tube shape.

Again with reference to FIGS. 1 and 1A, said second tubular section 20.1 and/or said third tubular section 30.1 can be made from a wire mesh, preferably electrically disconnected from other conductive elements, in which said wire mesh can be connected to ground in order to perform the function as an electric screen, and in which, where desired, said wire mesh can form a capacitive coupling with the bar B to detect the presence or absence of voltage on said bar B.

Figure 2:
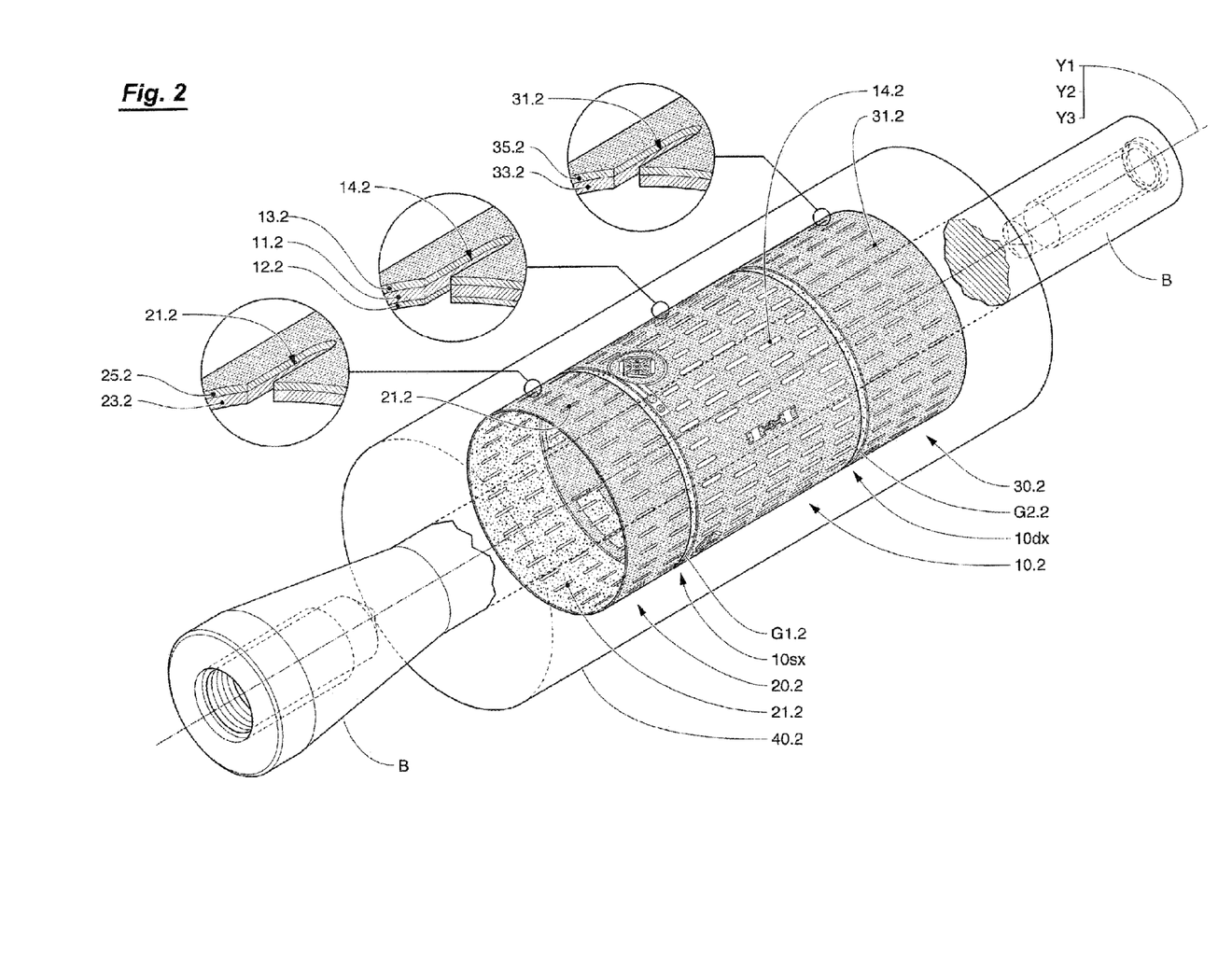
FIG. 2 is a schematic view of a second embodiment of a sensor assembly according to the present disclosure.
Figure 2A:
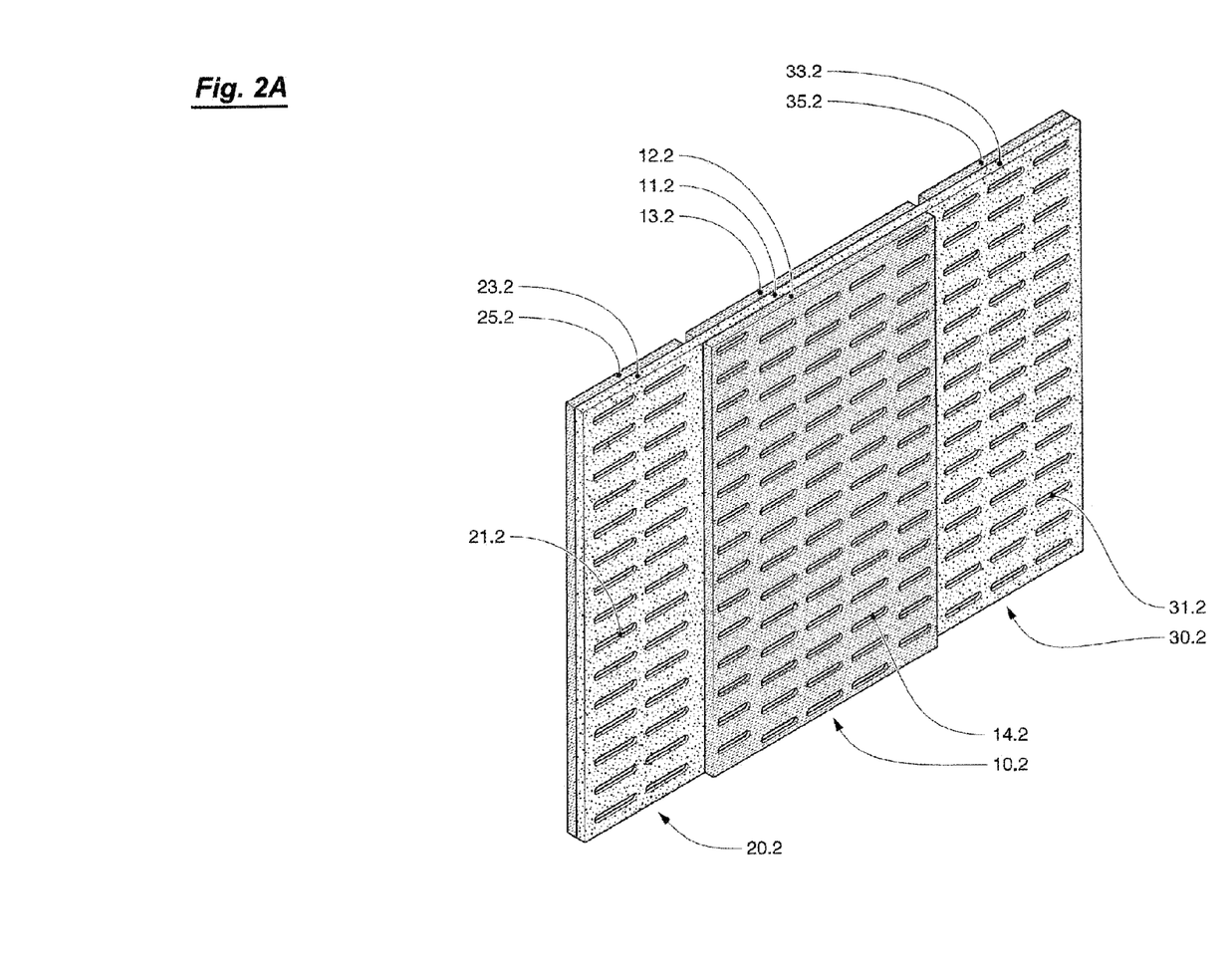
FIG. 2A is a schematic view of a tubular body in the embodiment in FIG. 2, laid flat.

With reference to FIGS. 2 and 2A, said sensor assembly, and more specifically said tubular body including said first, second and third tubular sections 20.2/10.2/30.2, can include: a self-supporting lamina of insulating material 23.2/11.2/33.2 able to perform the support function; a first thin inner layer 12.2 of electrically conductive material applied to said self-supporting lamina of insulating material 23.2/11.2/33.2 and electrically disconnected from the other layers of conductive material; a first thin outer layer 25.2 of conductive material applied to said self-supporting lamina of insulating material 23.2/11.2/33.2; a second thin outer layer 13.2 of conductive material applied to said self-supporting lamina of insulating material 23.2/11.2/33.2; a third thin outer layer 35.2 of conductive material applied to said self-supporting lamina of insulating material 23.2/11.2/33.2, in which said layers have specific axial lengths, preferably but without limitation as shown in FIG. 2A.

The first thin inner layer 12.2 may function as an electric field sensor, i.e. to form a capacitive coupling with the bar B; the first thin outer layer 25.2 may function as an electric screen, for example by connection to ground, and/or the function of detecting the presence or absence of voltage on the bar B; the second thin outer layer 13.2 may function as an electric screen, for example by means of a connection to ground; the third thin outer layer 35.2 may function as an electric screen, for example by means of a connection to ground; and/or the function of detecting the presence or absence of voltage on the bar B.

Preferably, with reference to the aforementioned structural description, said first tubular section 10.2, said second tubular section 20.2 and said third tubular section 30.2 are made using a single conductive double-sided Vetronite board (for example a copper double-sided Vetronite board—PCB), for example etched by photoengraving or mechanical milling and wrapped into a tube shape.

Figure 3:
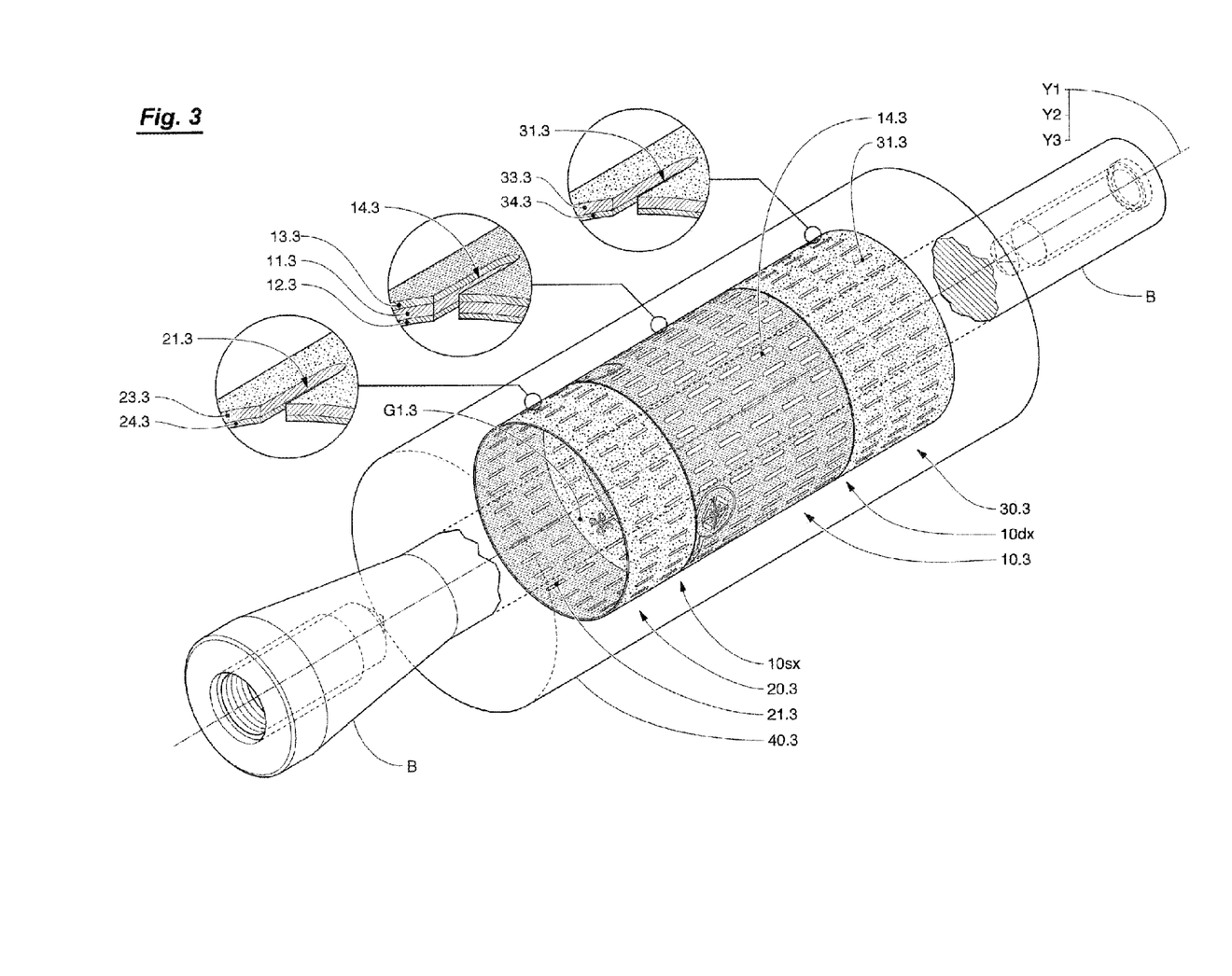
FIG. 3 is a schematic view of a third embodiment of a sensor assembly according to the present disclosure.
Figure 3A:
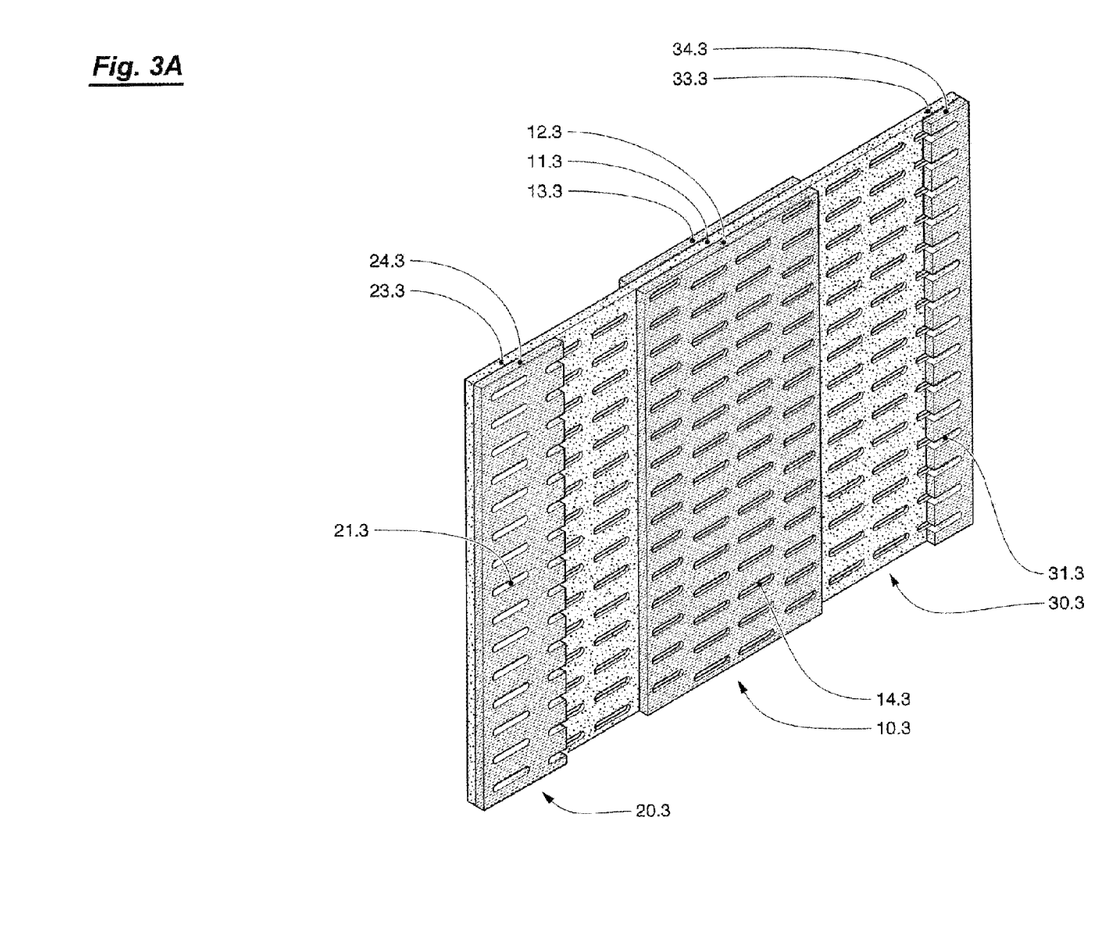
FIG. 3A is a schematic view of a tubular body in the embodiment in FIG. 3, laid flat.

With reference to FIGS. 3 and 3A, said sensor assembly, and more specifically said tubular body including said first, second and third tubular sections 20.3/10.3/30.3, can include: a self-supporting lamina of insulating material 23.3/11.3/33.3 able to perform the function of support lamina; a first thin inner layer 24.3 of conductive material applied to said self-supporting lamina of insulating material 23.3/11.3/33.3; a second thin inner layer 12.3 of conductive material applied to said self-supporting lamina of insulating material 23.3/11.3/33.3 and electrically disconnected from the other layers of conductive material; a third thin inner layer 34.3 of conductive material applied to said self-supporting lamina of insulating material 23.3/11.3/33.3; a first thin outer layer 13.3 of conductive material applied to said self-supporting lamina of insulating material 23.3/11.3/33.3; in which said layers have specific axial lengths, preferably but without limitation as shown in FIG. 3A.

The first thin inner layer 24.3 may function as an electric screen, for example by connection to ground, and/or the function of detecting the presence or absence of voltage on the bar B.

The second thin inner layer 12.3 may function as an electric field sensor, i.e. to form a capacitive coupling with the bar B.

The third thin inner layer 34.3 of conductive material may function as an electric screen, for example by connection to ground, and/or the function of detecting the presence or absence of voltage on the bar B.

The first thin outer layer 13.3 may function as an electric screen, for example by means of a connection to ground.

Preferably, with reference to the aforementioned structural description, said first tubular section 10.3, said second tubular section 20.3 and said third tubular section 30.3 are made using a single conductive double-sided Vetronite board (for example a copper double-sided Vetronite board—PCB), for example etched by photoengraving or mechanical milling and wrapped into a tube shape.

With reference to FIGS. 4-4A and 5-5A, the second tubular section 20.4/20.5 and/or said third tubular section 30.4/30.5 includes one or more cantilevered tabs 22.4, 32.4/22.5, 32.5.

More specifically, with reference to FIGS. 4-4A and 5-5A, the sensor assembly according to the present invention, in which said sensor assembly extends along a first longitudinal axis Y1, in which said sensor assembly comprises: a connecting bar B extending longitudinally along a respective second longitudinal axis Y2; a tubular body extending longitudinally along a third longitudinal axis Y3; a mass of dielectric material 40.4/40.5 designed to at least partially enclose the components of the sensor assembly; in which said tubular body is positioned coaxially about said connecting bar B; in which said tubular body is spaced apart radially from said central connecting bar B; has a tubular body with one or more cantilevered tabs 22.4, 32.4/22.5, 32.5.

Said tabs 22.4, 32.4/22.5, 32.5 are preferably oriented axially Y4 such that the free ends thereof 23.4, 33.4/23.5, 33.5 form at least one axial end of said tubular body, thereby forming crenelated axial ends.

Again preferably, two or more tabs 22.4/22.4, 32.4/32.4/22.5/22.5, 32.5/32.5, positioned side by side, are provided, in which the axial edge of a first tab 22.4, 32.4/22.5, 32.5 is spaced apart D4.4/D4.5 circumferentially from the axial edge of a second tab 22.4, 32.4/22.5, 32.5 positioned next to said first tab 22.4, 32.4/22.5, 32.5 in order to form axial through-openings 21.4/21.5.

Figure 4:
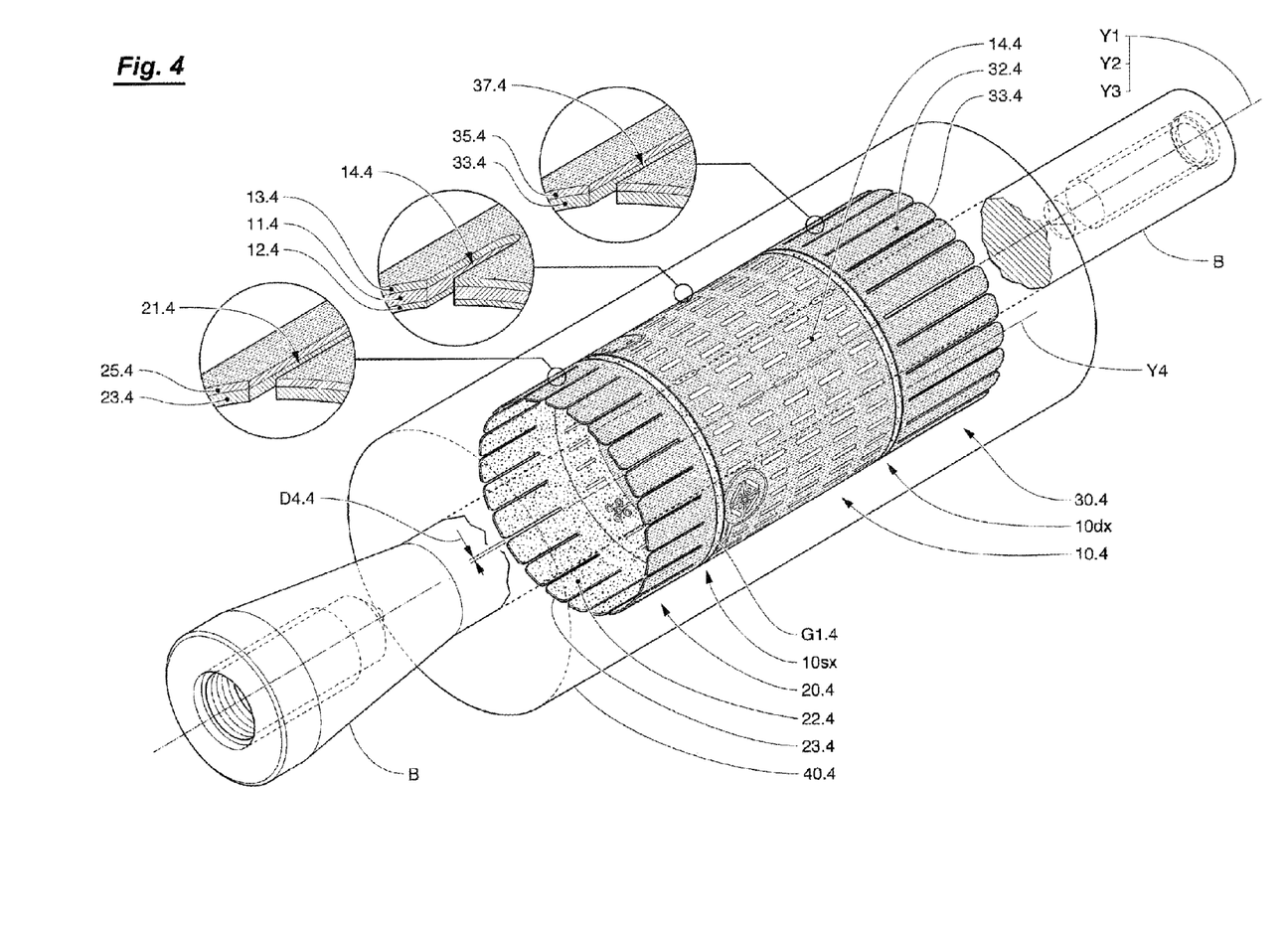
FIG. 4 is a schematic view of a fourth embodiment of a sensor assembly according to the present disclosure.
Figure 4A:
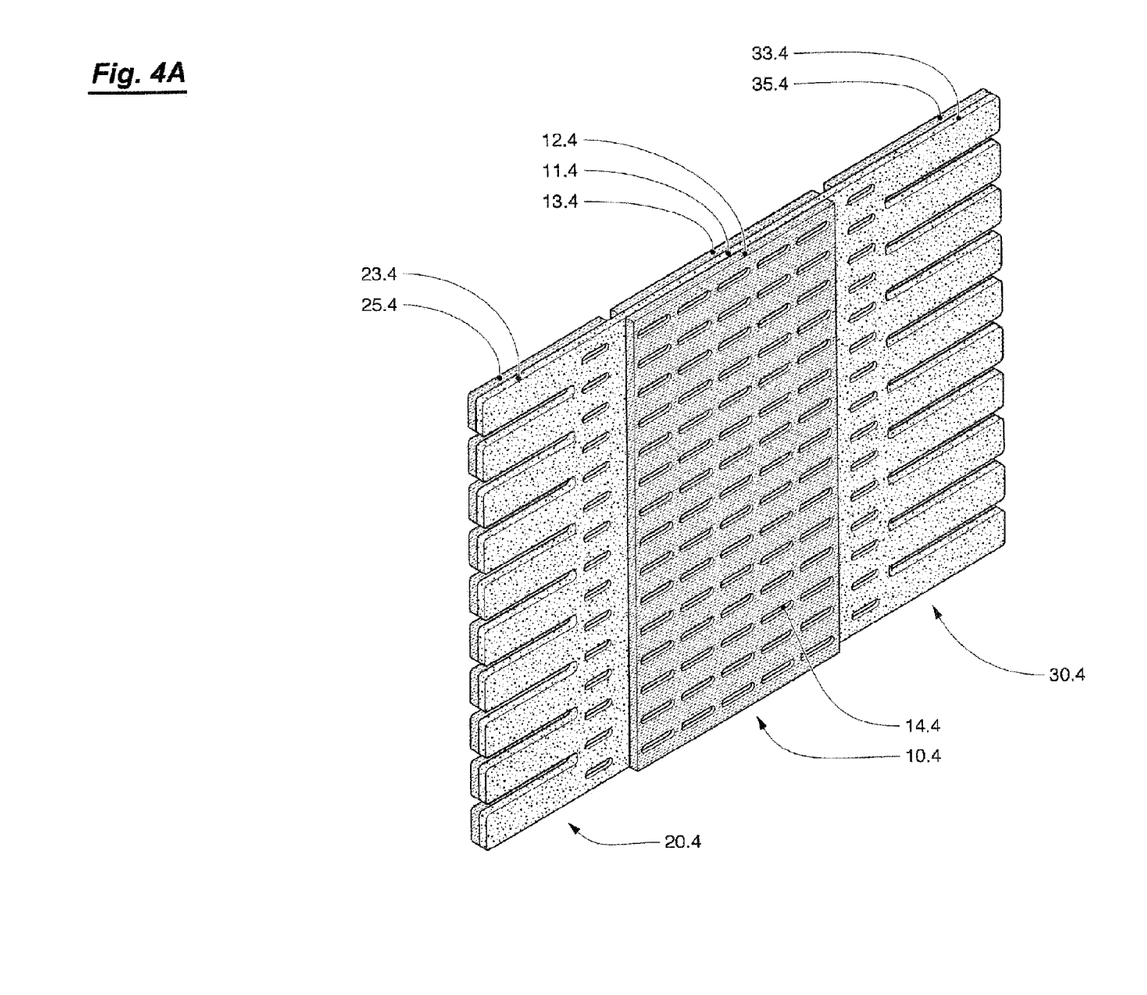
FIG. 4A is a schematic view of a tubular body in the embodiment in FIG. 4, laid flat.

Said through-openings 21.4 are wide enough to enable a resin of dielectric material in liquid/paste state to pass through said through-openings 21.4.

Again preferably, said tabs 22.4, 32.4/22.5, 32.5 are flexible and, more specifically, have a degree of flexibility selected in consideration of the shrinkage characteristics of the resin used in the casting, in order to enable said tabs to flex during the shrinkage phases of the resin that occur during solidification of said resin.

With reference to FIGS. 4 and 4A, said sensor assembly, and more specifically said tubular body including said first, second and third tubular sections 20.4/10.4/30.4, can include: a self-supporting lamina of insulating material 23.4/11.4/33.4 able to perform the support function; a first thin inner layer 12.4 of electrically conductive material applied to said self-supporting lamina of insulating material 23.4/11.4/33.4 and electrically disconnected from the other layers of conductive material; a first thin outer layer 25.4 of conductive material applied to said self-supporting lamina of insulating material 23.4/11.4/33.4; a second thin outer layer 13.4 of conductive material applied to said self-supporting lamina of insulating material 23.4/11.4/33.4; a third thin outer layer 35.4 of conductive material applied to said self-supporting lamina of insulating material 23.4/11.4/33.4.

The first thin inner layer 12.4 may function as an electric field sensor, i.e. to form a capacitive coupling with the bar B.

The first thin outer layer 25.4 may function as an electric screen, for example by connection to ground, and/or the function of detecting the presence or absence of voltage on the bar B.

The second thin outer layer 13.4 may function as an electric screen, for example by means of a connection to ground.

The third thin outer layer 35.4 may function as an electric screen, for example by connection to ground, and/or the function of detecting the presence or absence of voltage on the bar B.

Preferably, with reference to the aforementioned structural description, said first tubular section 10.4, said second tubular section 20.4 and said third tubular section 30.4 are made using a single copper double-sided Vetronite board (PCB), for example etched by photoengraving or mechanical milling and wrapped into a tube shape.

Figure 5:
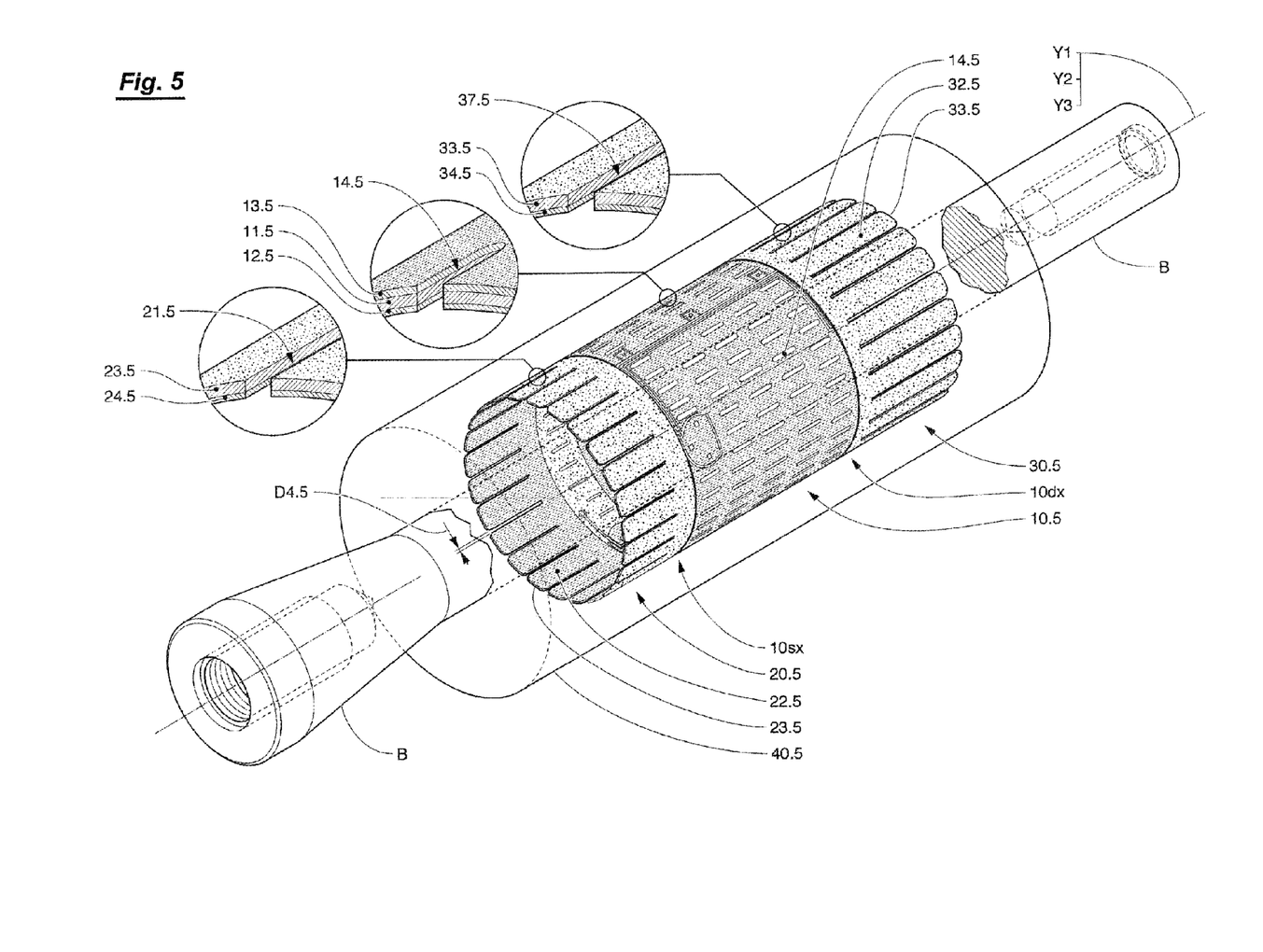
FIG. 5 is a schematic view of a fifth embodiment of a sensor assembly according to the present disclosure.
Figure 5A:
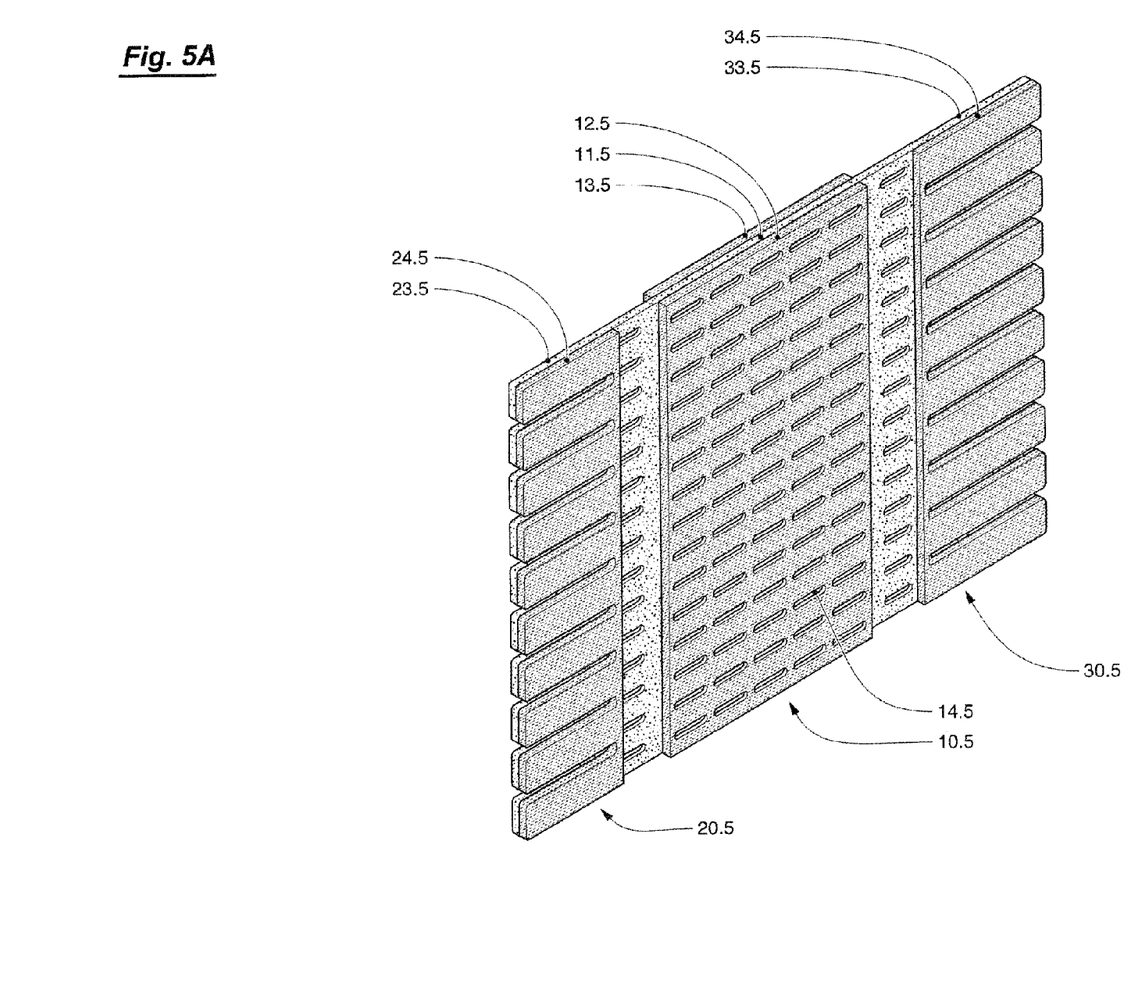
FIG. 5A is a schematic view of a tubular body in the embodiment in FIG. 5, laid flat.

With reference to FIGS. 5 and 5A, said sensor assembly, and more specifically said tubular body including said first, second and third tubular sections 20.5/10.5/30.5, can include: a self-supporting lamina of insulating material 23.5/11.5/33.5 able to perform the support function; a first thin outer layer 13.5 of conductive material applied to said self-supporting lamina of insulating material 23.5/11.5/33.5; a first thin inner layer 24.5 of conductive material applied to said self-supporting lamina of insulating material 23.5/11.5/33.5; a second thin inner layer 12.5 of conductive material applied to said self-supporting lamina of insulating material 23.5/11.5/33.5; and a third thin inner layer 34.5 of conductive material applied to said self-supporting lamina of insulating material 23.4/11.4/33.4.

The first thin outer layer 13.5 may function as an electric screen, for example by means of a connection to ground.

The first thin inner layer 24.5 may function as an electric screen, for example by connection to ground, and/or the function of detecting the presence or absence of voltage on the bar B.

The second thin inner layer 12.5 may function as an electric field sensor, i.e. to form a capacitive coupling with the bar B.

The third thin inner layer 34.5 may function as an electric screen, for example by connection to ground, and/or the function of detecting the presence or absence of voltage on the bar B.

Preferably, with reference to the aforementioned description, said first tubular section 10.5, said second tubular section 20.5 and said third tubular section 30.5 are made using a single copper double-sided Vetronite board (PCB), for example etched by photoengraving or mechanical milling and wrapped into a tube shape.

Although the disclosure has been described in detail with reference to certain preferred embodiments, variations and modifications exist within the scope and spirit of one or more independent aspects of the disclosure as described. In addition, some aspects of the present disclosure may include, but are not limited to:

Aspect 1. Sensor assembly regarding a through isolator, wherein said sensor assembly extends along a first longitudinal axis (Y1), wherein said sensor assembly comprises: a connecting bar (B) extending longitudinally along a respective second longitudinal axis (Y2); a tubular body extending longitudinally along a third longitudinal axis (Y3); a mass of dielectric material (4.1/40.2/40.3/40.4/40.5) able for incorporating at least partially the components of the sensor assembly; wherein said tubular body is positioned coaxially around said connecting bar (B); wherein said tubular body is radially spaced with respect to said central connecting bar (B); characterized by the fact that said tubular body comprises a first tubular section (10.1/10.2/10.3/10.4/10.5) comprising: a first self-supporting tubular laminar element (11.1/11.2/11.3/11.4/11.5) made of insulating material; a first thin layer of electrically conductive material (12.1/12.2/12.3/12.4/12.5) applied on one or more inner faces of said first self-supporting tubular laminar element (11.1/11.2/11.3/11.4/11.5); a second thin layer of electrically conductive material (13.1/13.2/13.3/13.4/13.5) applied on one or more external faces of said first self-supporting tubular laminar element (11.1/11.2/11.3/11.4/11.5); by the fact that said first self supporting tubular laminar element (11.1/11.2/11.3/11.4/11.5) is able to perform the function of supporting structure; by the fact that said first thin layer of electrically conductive material (12.1/12.2/12.3/12.4/12.5) is able to perform the function of an electric field sensor; by the fact that said second thin layer of electrically conductive material (13.1/13.2/13.3/13.4/13.5) is able to perform the function of an electric screen; by the fact to further comprising a second tubular section (20.1/20.2/20.3/20.4/20.5); by the fact that said second tubular section (20.1/20.2/20.3/20.4/20.5) is positioned axially at the side of a first axial end (10sx) of the first tubular section (10.1/10.2/10.3/10.4/10.5); and by the fact that said second tubular section (20.1/20.2/20.3/20.4/20.5) is able to perform the function of electric screen.

Aspect 2. Sensor assembly according to aspect 1, characterized by the fact that it further comprises a third tubular section (30.1/30.2/30.3/30.4/30.5); by the fact that said third tubular section (30.1/30.2/30.3/30.4/30.5) is positioned axially at the side of a second axial end (10dx) of the first tubular section (10.1/10.2/10.3/10.4/10.5); and by the fact that said third tubular section (30.1/30.2/30.3/30.4/30.5) is able to perform the function of electric screen.

Aspect 3. Sensor assembly according to aspect 1 or 2, characterized by the fact that said first tubular section (10.1) is made by means of a double-sided plain copper PCB and by the fact that said second tubular section (20.1) and/or said third tubular section (30.1) are made of a wire mesh.

Aspect 4. Sensor assembly according to one of aspects 1 to 3, characterized in that it comprises: a self-supporting lamina of insulating material (23.2/11.2/33.2) suitable for carrying out the support function; a first thin inner layer (12.2) of conductive material applied to said self-supporting lamina of insulating material (23.2/11.2/33.2) and electrically disconnected with respect the other layers of conductive material; a first thin outer layer (25.2) of conductive material applied to said self-supporting lamina of insulating material (23.2/11.2/33.2); a second thin outer layer (13.2) of conductive material applied to said self-supporting lamina of insulating material (23.2/11.2/33.2); and a third thin outer layer (35.2) of conductive material applied to said self-supporting lamina of insulating material (23.2/11.2/33.2) and by the fact that the first thin inner layer (12.2) is able to perform the function of sensor of the electric field generated by the connecting bar (B), the first thin outer layer (25.2) is able to perform the function of an electric screen, the second thin outer layer (13.2) is suitable to perform the function of an electric screen; and the third thin outer layer (35.2) is adapted to perform the function of an electric screen.

Aspect 5. Sensor assembly according to aspect 4, characterized by the fact that said first tubular section (10.2) said second tubular section (20.2) and said third tubular section (30.2) are made by means of a double-sided plain copper PCB.

Aspect 6. Sensor assembly according to aspect 1 or 2, characterized by the fact that it comprises: a self-supporting foil of insulating material (23.3/11.3/33.3) suitable for carrying out the supporting foil function; a first thin inner layer (24.3) of conductive material applied to said self-supporting lamina of insulating material (23.3/11.3/33.3); a second thin inner layer (12.3) of conductive material applied to said self-supporting lamina of insulating material (23.3/11.3/33.3) and electrically disconnected from the other layers of conductive material; a third thin inner layer (33.3) of conductive material applied to said self-supporting lamina of insulating material (23.3/11.3/33.3); a first thin outer layer (13.3) of conductive material applied to said self-supporting lamina of insulating material (23.3/11.3/33.3); and by the fact that the first thin inner layer (24.3) is able to perform the function of an electric screen, the second thin inner layer (12.3) is able to perform the function of sensor of the electric field generated by the connecting bar (B), the third thin inner layer (34.3) is able to perform the function of an electric screen, the first thin outer layer (13.3) is able to perform the function of an electric screen.

Aspect 7. Sensor assembly according to aspect 6, characterized by the fact that said first tubular section (10.3) said second tubular section (20.3) and said third tubular section (30.3) are made by means of double-sided plain copper PCB.

Aspect 8. Sensor assembly according to any one of aspects 1 to 7, characterized by the fact that said second tubular section (20.4/20.5) and/or said third tubular section (30.4/30.5) comprises one or more tabs (22.4, 32.4/22.5, 32.5) supported in an by cantilever manner.

Aspect 9. Sensor assembly regarding a through isolator, wherein said sensor assembly extends along a first longitudinal axis (Y1), wherein said sensor assembly comprises: a connecting bar (B) extending longitudinally along a respective second longitudinal axis (Y2); a tubular body extending longitudinally along a third longitudinal axis (Y3); a mass of dielectric material (40.4/40.5) able for incorporating at least partially the components of the sensor assembly; wherein said tubular body is positioned coaxially around said connecting bar (B); wherein said tubular body is radially spaced with respect to said central connecting bar (B); characterized by the fact that said tubular body comprises one or more tabs (22.4, 32.4/22.5, 32.5) supported in a cantilever manner.

Aspect 10. Sensor assembly according to aspect 8 or 9, characterized by the fact that said tabs (22.4, 32.4/22.5, 32.5) are axially oriented (Y4) in order to configure with their free ends (23.4, 33.4/23.5, 33.5) at least one axial end of the tubular body.

Aspect 11. Sensor assembly according to aspect 8, 9 or 10, characterized by the fact to comprises two or more tabs (22.4/22.4, 32.4/32.4/22.5/22.5, 32.5/32.5) positioned side by side.

Aspect 12. Sensor assembly according to aspect 11, characterized by the fact that the axial edge of a first tab (22.4, 32.4/22.5, 32.5) is circumferentially spaced (D4.4/D4.5) with respect to the axial edge of a second tab (22.4, 32.4/22.5, 32.5) positioned next to said first tab (22.4, 32.4/22.5, 32.5) in order to form axial through openings (21.4/21.5).

Aspect 13. Sensor assembly according to one of the aspects from 8 to 12, characterized by the fact that said tabs (22.4, 32.4/22.5, 32.5) are flexible.

Aspect 14. Sensor assembly according to one of the aspects from 1 to 13, characterized by the fact that at least one axial end of said tubular body has the shape.

Aspect 15. Sensor assembly according to one of the aspects from 8 to 14, characterized by the fact that it comprises: a self-supporting foil of insulating material (23.4/11.4/33.4) able for carrying out the support function; a first thin inner layer (12.4) of conductive material electrically applied to said self-supporting lamina of insulating material (23.4/11.4/33.4) and disconnected from the other layers of conductive material; a first thin outer layer (25.4) of conductive material applied to said self-supporting lamina of insulating material (23.4/11.4/33.4); a second thin outer layer (13.4) of conductive material applied to said self-supporting lamina of insulating material (23.4/11.4/33.4); a third thin outer layer (35.4) of conductive material applied to said self-supporting lamina of insulating material (23.4/11.4/33.4); and by the fact that the first thin inner layer (12.4) is able to detect the electric field generated by the connecting rod (B), the first thin outer layer (25.4) is able to perform the function of an electric screen, the second thin outer layer (13.4) is able to perform the function of an electric screen, the third thin outer layer (35.4) is able to perform the function of an electric screen.

Aspect 16. Sensor assembly according to aspect 15, characterized by the fact that said first tubular section (10.4) said second tubular section (20.4) and said third tubular section (30.4) are made by are made by means of a double-sided plain copper PCB.

Aspect 17. Sensor assembly according to one of the aspects from 8 to 24, characterized by the fact that it comprises: a self-supporting foil of insulating material (23.5/11.5/33.5) suitable for carrying out the support function; a first thin outer layer (13.5) of conductive material applied to said self-supporting lamina of insulating material (23.5/11.5/33.5); a first thin inner layer (24.5) of conductive material applied to said self-supporting lamina of insulating material (23.5/11.5/33.5); a second thin inner layer (12.5) of conductive material applied to said self-supporting lamina of insulating material (23.5/11.5/33.5); a third thin inner layer (34.5) of conductive material applied to said self-supporting lamina of insulating material (23.4/11.4/33.4); and by the fact that the first thin outer layer (13.5) is able to perform the function of an electric screen, the first thin inner layer (24.5) is able to perform the function of an electric screen, the second thin inner layer (12.5) is able to perform the electric field generated by the connecting bar (B), the third thin inner layer (34.5) is able to perform the function of an electric screen.

Aspect 18. Sensor assembly according to aspect 17, characterized by the fact that said first tubular section (10.5) said second tubular section (20.5) and said third tubular section (30.5) are made by a double-sided plain copper PCB.

Various features of the disclosure are set forth in the following claims.

What is claimed is:

1. A sensor assembly comprising:
   an electrode extending along a longitudinal axis;
   a first tubular section extending along the longitudinal axis and at least partially surrounding the electrode such that the first tubular section is radially spaced from the electrode, the first tubular section including
     a first support member portion made of an insulating material,
     an electric field sensor comprising a first layer of electrically conductive material disposed on an inner surface of the first support member portion, the electric field sensor configured to detect an electric field produced by the electrode, wherein the electric field sensor surrounds and is spaced in a direction radially outward from the longitudinal axis and from a portion of the electrode, and
     a first electric screen comprising a second layer of electrically conductive material disposed on an outer surface of the first support member portion, the first electric screen electrically isolated from the electric field sensor and configured to shield the electric field sensor from outside electric interference, wherein an axial length of the first layer of electrically conductive material is less than an axial length of the second layer of electrically conductive material;
   a second tubular section disposed adjacent a first end of the first tubular section along the longitudinal axis, the second tubular section including
     a second support member portion made of an insulating material, and
     a third layer of electrically conductive material disposed on an inner surface or an outer surface of the second support member portion, wherein the third layer of electrically conductive material is electrically isolated from the first layer of electrically conductive material and the second layer of electrically conductive material, wherein the third layer of electrically conductive material is configured to shield against outside electric interference or configured to detect an electric field produced by the electrode as an electric field sensor; and
   a dielectric material at least partially enclosing the first and second tubular sections, wherein the dielectric material fills through-openings in the first tubular section.

2. The sensor assembly of claim 1, wherein the first support member portion and the second support member portion are formed as a unitary structure.

3. The sensor assembly of claim 1, wherein the second tubular section includes through-openings filled with the dielectric material, and wherein the through-openings in the first tubular section are configured as elongated slits.

4. The sensor assembly of claim 1, wherein the second tubular section includes a plurality of cantilevered tabs extending parallel to the longitudinal axis.

5. The sensor assembly of claim 1, wherein an axial length of the first tubular section is different from an axial length of the second tubular section.

6. The sensor assembly of claim 1, further comprising a third tubular section disposed adjacent a second end of the first tubular section opposite the first end along the longitudinal axis, the third tubular section including
   a third support member portion made of an insulating material, and
   a fourth layer of electrically conductive material disposed on an inner surface or
   an outer surface of the third support member portion, and wherein the fourth layer is electrically isolated from the first layer, wherein the fourth layer is configured to shield against outside electric interference or configured to detect an electric field produced by the electrode as an electric field sensor.

7. The sensor assembly of claim 6, wherein the first support member portion, the second support member portion, and the third support member portion are formed as a unitary structure.

8. The sensor assembly of claim 6, wherein the third tubular section includes through-openings filled with dielectric material.

9. A sensor assembly comprising:
   an electrode extending along a longitudinal axis; and
   a tubular body extending along the longitudinal axis and at least partially surrounding the electrode such that the tubular body is radially spaced from the electrode, the tubular body including
     a first tubular section comprising a printed circuit board, wherein the printed circuit board includes
       a support member made of an insulating material,
       an electric field sensor comprising a first layer of electrically conductive material disposed on an inner surface of the support member, the electric field sensor configured to detect an electric field produced by the electrode, and
       a first electric screen comprising a second layer of electrically conductive material disposed on an outer surface of the support member, the first electric screen isolated from the first layer of electrically conductive material and configured to shield the electric field sensor from outside electric interference, and
     a second tubular section disposed adjacent a first end of the first tubular section along the longitudinal axis, the second tubular section including
       a second electric screen positioned axially along the longitudinal axis from the first electric screen, wherein the second electric screen is electrically isolated from the second layer of electrically conductive material, and wherein the second electric screen is configured to shield against outside electric interference or configured to detect an electric field produced by the electrode as an electric field sensor; and
   a dielectric material at least partially enclosing the tubular body, wherein the dielectric material fills through-openings in the tubular body.

10. The sensor assembly of claim 9, wherein the tubular body includes a plurality of cantilevered tabs circumferentially spaced apart around the tubular body and extending parallel to the longitudinal axis.

11. The sensor assembly of claim 10, wherein the plurality of tabs extends from an axial end of the second tubular section opposite the first end of the first tubular section.

12. The sensor assembly of claim 9, wherein the second electric screen comprises a third layer of electrically conductive material disposed on an inner surface or an outer surface of a support member.

13. The sensor assembly of claim 9, wherein the second electric screen comprises wire mesh.

14. The sensor assembly of claim 9, wherein the axial length of the first layer of electrically conductive material is less than an axial length of the support member.

15. The sensor assembly of claim 9, wherein the through-openings of the tubular body are configured as elongated slits.

16. The sensor assembly of claim 9, wherein the electric field sensor is flexible.

17. A sensor assembly comprising:
an electrode extending along a longitudinal axis;
a first tubular section extending along the longitudinal axis and at least partially surrounding the electrode such that the first tubular section is radially spaced from the electrode, the tubular section including
a support member made of an insulating material,
an electric field sensor comprising a first layer of electrically conductive material disposed on an inner surface of the support member, the electric field sensor configured to detect an electric field produced by the electrode, wherein the electric field sensor surrounds and is spaced in a direction radially outward from the longitudinal axis and from a portion of the electrode, and
a first electric screen comprising a second layer of electrically conductive material disposed on an outer surface of the support member, the first electric screen electrically isolated from the electric field sensor and configured to shield the electric field sensor from outside electric interference, wherein an axial length of the first layer of electrically conductive material is less than an axial length of the second layer of electrically conductive material;
a second tubular section disposed adjacent a first end of the first tubular section along the longitudinal axis, the second tubular section including
a second electric screen positioned axially along the longitudinal axis from the first electric screen, wherein the second electric screen is electrically isolated from the second layer of electrically conductive material, and wherein the second electric screen is configured to shield against outside electric interference or configured to detect an electric field produced by the electrode as an electric field sensor; and
a dielectric material at least partially enclosing the first and second tubular sections, wherein the dielectric material fills through-openings in the first and second tubular sections.

18. The sensor assembly of claim 17, wherein the through-openings in the first tubular section are configured as elongated slits.

19. The sensor assembly of claim 17, wherein the first tubular section includes a printed circuit board.

20. The sensor assembly of claim 17, wherein the second electric screen includes wire mesh.

21. A sensor assembly comprising:
an electrode extending along a longitudinal axis;
a first tubular section extending along the longitudinal axis and at least partially surrounding the electrode such that the first tubular section is radially spaced from the electrode, the first tubular section including
a support member made of an insulating material,
a first layer of electrically conductive material disposed on an inner surface of the support member, wherein the first layer of electrically conductive material surrounds and is spaced in a direction radially outward from the longitudinal axis and from a portion of the electrode, and
a second layer of electrically conductive material disposed on an outer surface of the support member;
a second tubular section disposed adjacent an end of the first tubular section along the longitudinal axis, wherein the second tubular section includes wire mesh, and wherein the second tubular section is electrically isolated from the second layer of electrically conductive; and
a dielectric material at least partially enclosing the first and second tubular sections, wherein the dielectric material fills through-openings in the first tubular section.

22. The sensor assembly of claim 21, wherein the through-openings in the first tubular section are configured as elongated slits.

23. The sensor assembly of claim 21, wherein the first tubular section includes a printed circuit board.

24. The sensor assembly of claim 21, wherein an axial length of the first layer of electrically conductive material is less than an axial length of the second layer of electrically conductive material.

25. The sensor assembly of claim 21, wherein the first and second layers of electrically conductive material each includes through-openings.

26. The sensor assembly of claim 21, wherein the wire mesh of the second tubular section is configured to shield against outside electric interference or configured to detect an electric field produced by the electrode as an electric field sensor.

* * * * *